United States Patent
Davenport

(10) Patent No.: US 6,222,991 B1
(45) Date of Patent: *Apr. 24, 2001

(54) METHOD FOR ROTATIONALLY ALIGNING AND DEGASSING SEMICONDUCTOR SUBSTRATE WITHIN SINGLE VACUUM CHAMBER

(75) Inventor: Robert E. Davenport, San Jose, CA (US)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/360,188

(22) Filed: Jul. 23, 1999

Related U.S. Application Data

(62) Division of application No. 08/383,112, filed on Feb. 3, 1995, now Pat. No. 5,982,986.

(51) Int. Cl.[7] .................................................. F26B 3/30
(52) U.S. Cl. ...................... 392/418; 219/405; 118/724; 118/725
(58) Field of Search .................... 392/416, 418; 219/405, 411, 390; 118/724, 725, 728, 730, 50.1; 427/521, 545, 557, 592; 437/247; 361/234

(56) References Cited

U.S. PATENT DOCUMENTS

| | | | |
|---|---|---|---|
| 4,724,060 | 2/1988 | Sakata et al. ...................... 204/298 |
| 4,771,730 | * 9/1988 | Tezuka ................................. 118/723 |
| 5,009,590 | 4/1991 | Mitarai et al. ........................ 432/121 |
| 5,113,102 | 5/1992 | Gilmore ................................. 310/88 |
| 5,324,540 | 6/1994 | Terada ................................ 427/255.5 |
| 5,370,739 | * 12/1994 | Foster et al. ........................... 118/725 |
| 5,382,803 | 1/1995 | Asakawa .......................... 250/492.21 |
| 5,421,893 | * 6/1995 | Perlov .................................... 118/725 |
| 5,444,217 | 8/1995 | Moore et al. .......................... 219/405 |
| 5,566,043 | 10/1996 | Kawada et al. ....................... 361/234 |
| 5,630,881 | * 5/1997 | Ogure et al. .......................... 118/730 |

FOREIGN PATENT DOCUMENTS

| | | | |
|---|---|---|---|
| 0 493 089 | 12/1991 | (EP) | H01L/21/68 |
| 58 048915 | 3/1983 | (JP) | H01L/21/205 |
| 4-204313 | * 11/1983 | (JP) | . |
| 60-117714 | * 11/1983 | (JP) | . |
| 61-142743 | 12/1984 | (JP) | H01L/21/30 |
| 4-204313 | 11/1990 | (JP) | G01B/11/26 |

OTHER PUBLICATIONS

Chapman, Brian, *Glow Dishcharge Processes: Sputtering and Plasma Etching*(USA: John Wiley & Sons), 1980, pp. 297 and 328.

* cited by examiner

Primary Examiner—Teresa Walberg
Assistant Examiner—Shawntina Fuqua
(74) Attorney, Agent, or Firm—John P. Taylor

(57) ABSTRACT

A semiconductor processing apparatus and process is disclosed which is capable of degassing a semiconductor substrate and also orienting the substrate in the same vacuum chamber. The apparatus includes an electrostatic clamping structure for retaining the entire undersurface of a semiconductor substrate in thermal communication therewith in the vacuum chamber, a heater located within the electrostatic clamping structure for heating the electrostatically clamped substrate to degas it, a rotation mechanism for imparting rotation to the substrate in the vacuum chamber, and a detector for detecting the rotational alignment of the substrate in response to the rotation of the substrate. In a preferred embodiment, the substrate is rotated to rotationally align it as it is being heated to degas it.

11 Claims, 3 Drawing Sheets

METHOD FOR ROTATIONALLY ALIGNING AND DEGASSING SEMICONDUCTOR SUBSTRATE WITHIN SINGLE VACUUM CHAMBER

CROSS-REFERENCE TO RELATED APPLICATION

This application is a division of U.S. patent application Ser. No. 08/383,112 filed Feb. 3, 1995 now U.S. Pat. No. 5,982,986 on Nov. 9, 1999.

BACKGROUND OF THE INVENTION

1. Field of the Invention

This invention relates to semiconductor substrate processing. More particularly, this invention relates to apparatus and method for rotationally aligning and degassing a semiconductor substrate in the same vacuum chamber.

2. Description of the Related Art

In the processing of semiconductor substrates or wafers in the formation of integrated circuit structures thereon, it is important that the wafer be thoroughly degassed to remove adsorbed gases, moisture, etc. from the wafer prior to, for example, performing a physical vapor deposition (PVD) process to deposit materials on the wafer by sputtering from a target in a vacuum processing chamber. Other processes such as advanced chemical vapor deposition (CVD) processing, may also require degassing of the wafer. Degassing prior to PVD processing conventionally is carried out at temperatures exceeding 350° C. for time periods of from about 40 seconds to about 2 minutes to remove sufficient gases from the wafer to assure a satisfactory deposition by sputtering. Outgassing of substrates during aluminum PVD is more severe than during the prior CVD steps because the PVD process is performed at much higher vacuums and somewhat higher substrate temperatures, both of which induce greater outgassing. Therefore, to avoid outgassing from contaminating the PVD process, the de-gassing of the wafer before the first PVD step must be more extensive than the de-gassing performed before the CVD steps.

Degassing of a wafer is conventionally carried out in one of two ways. One method used to degas a wafer comprises a radiant heating of the wafer, using heat lamps located external to the vacuum chamber containing the wafer, and positioned adjacent transparent windows through which the heat is radiated from the lamps to the wafer. This method is relatively low in cost, is fairly rapid, and does not require clamping the wafer to the wafer support within the vacuum chamber. However, the radiant heating method is unsatisfactory for temperatures in excess of 350° C., because the temperature of the wafer is not easily controlled, and the heating is usually not uniform across the entire wafer. Typical temperature nonuniformity across the wafer at 350° C. is greater than ±30° C. Furthermore, alignment of the rotational orientation of the wafer, during the degassing step, is usually not possible because the radiation from the heat lamps interferes with operation of the optical means conventionally used for such rotational alignment.

The other method conventionally used to degas a wafer, particularly when subsequent PVD processing will be carried out which requires degassing at temperatures in excess of about 350° C., comprises physically (mechanically) clamping the wafer to a wafer support in a vacuum chamber and then heating the wafer using a resistive heater located in the wafer support adjacent the undersurface of the wafer resting on the wafer support. However, since the wafer normally only physically touches the wafer support at the physically clamped periphery or edges of the wafer, and the transmission of heat from the heater in the wafer support to the underside of the wafer via conduction through a vacuum is very poor, a thermally-conductive gas is normally admitted into the space between the wafer support and the underside of the wafer, with the clamped edge of the wafer serving to at least partially retain the gas in this space. This heating method permits degassification temperatures of as high as about 500–600° C. to be achieved.

This method thus permits the use of degassing temperatures in excess of 350° C., and permits measurement and reasonable control of the temperature of the wafer. However, alignment of the rotational orientation usually cannot be carried out during the degassing step because the conduit for the thermally conductive gas inhibits rotation of the chuck. The clamping ring also inhibits rotation due to its weight. Rotation of a clamped wafer could also cause wafer breakage and particles. The alignment of the rotational orientation of the wafer must, therefore, be carried out in a separate chamber prior to the degassing step. Furthermore, because this form of degassing must be preformed in a chamber very similar to a PVD chamber (i.e., it must include a cryopump, heated chuck, wafer lift assembly, cryo isolation valve, transfer chamber, isolation valve, clamp ring, etc.), it is a very expensive solution. Also typical temperature uniformities across the wafer achieved with this type of degassing apparatus are approximately ±10 to 15° C. Temperature uniformities of ±5° C. are required for advanced devices.

Furthermore, regardless of which heating method is used, because of the extended time period needed for degassing prior to PVD processing, the degassing step can reduce process throughput. One prior art approach which has been considered for solving this particular problem is to provide parallel degassing chambers, i.e., two degassing chambers are provided in a semiconductor wafer processing apparatus for each PVD processing chamber. However, this adds considerable extra cost to the apparatus. In addition, when the rotational orientation of the wafer must also be carried out in a separate chamber, either three or four preprocessing chambers must be utilized (depending whether or not each of the two parallel degassing chamber is coupled to its own separate rotational orientation chamber), which greatly adds to the overall expense of the apparatus.

It would, therefore, be desirable to be able to consolidate the rotational alignment and degassing of the wafer into a single chamber which would avoid the expense of separate chambers, as well as the additional time consumed during transfer of the wafer from one chamber to the other. It would be of further advantage if the degassing could be carried out at high temperatures, i.e., temperatures in excess of about 350° C., without mechanically clamping the wafer to the wafer support, and while still maintaining an even and controllable heating of the wafer. It would be even more advantageous if both the degassing and the rotational orientation of the wafer could be carried out simultaneously in the same chamber at a high temperature and without mechanical clamping the wafer to the wafer support.

SUMMARY OF THE INVENTION

In accordance with the invention, a semiconductor processing system is provided which is capable of degassing a semiconductor substrate at temperatures as high as 500° C. and also rotationally aligning the substrate in the same vacuum chamber, without the use of a mechanical clamping ring and thermally conductive gas. The apparatus of the semiconductor processing system includes a heated electrostatic clamping structure for supporting the semiconductor wafer and retaining the substrate in thermal communication therewith in the vacuum chamber, a heater within the electrostatic clamping structure for heating the electrostatically clamped substrate to degas it, a rotation mechanism for imparting rotation to the substrate in the same vacuum chamber, and a detector for detecting the rotational alignment of the substrate in the vacuum chamber in response to the rotation of the substrate. In a preferred embodiment, the substrate is rotated to rotationally align it as it is being heated to degas it without, however, using mechanical clamping apparatus to secure the substrate to a substrate support. In an alternate embodiment, the substrate may be rotated for alignment either prior to or after degassification, but in the same chamber,

DETAILED DESCRIPTION OF THE INVENTION

The invention comprises a semiconductor processing system capable of degassing a semiconductor substrate or wafer at temperatures as high as 500° C. or higher, depending upon the temperature sensitivity of other materials already on the wafer, and also capable of aligning the rotational orientation of the wafer in the same vacuum chamber, without the use of a mechanical clamping ring and thermally conductive gas. The system utilizes an electrostatic clamping means for retaining the semiconductor wafer in thermal communication with a wafer support in the vacuum chamber while the wafer is heated by a heater within the wafer support to degas it. A rotation mechanism for imparting rotation to the wafer in the vacuum chamber and a detector for detecting the rotational alignment of the wafer in response to the rotation of the wafer are also provided. In a preferred embodiment, the wafer is simultaneously rotated to rotationally align it while it is being heated to degas it.

Figure 1:
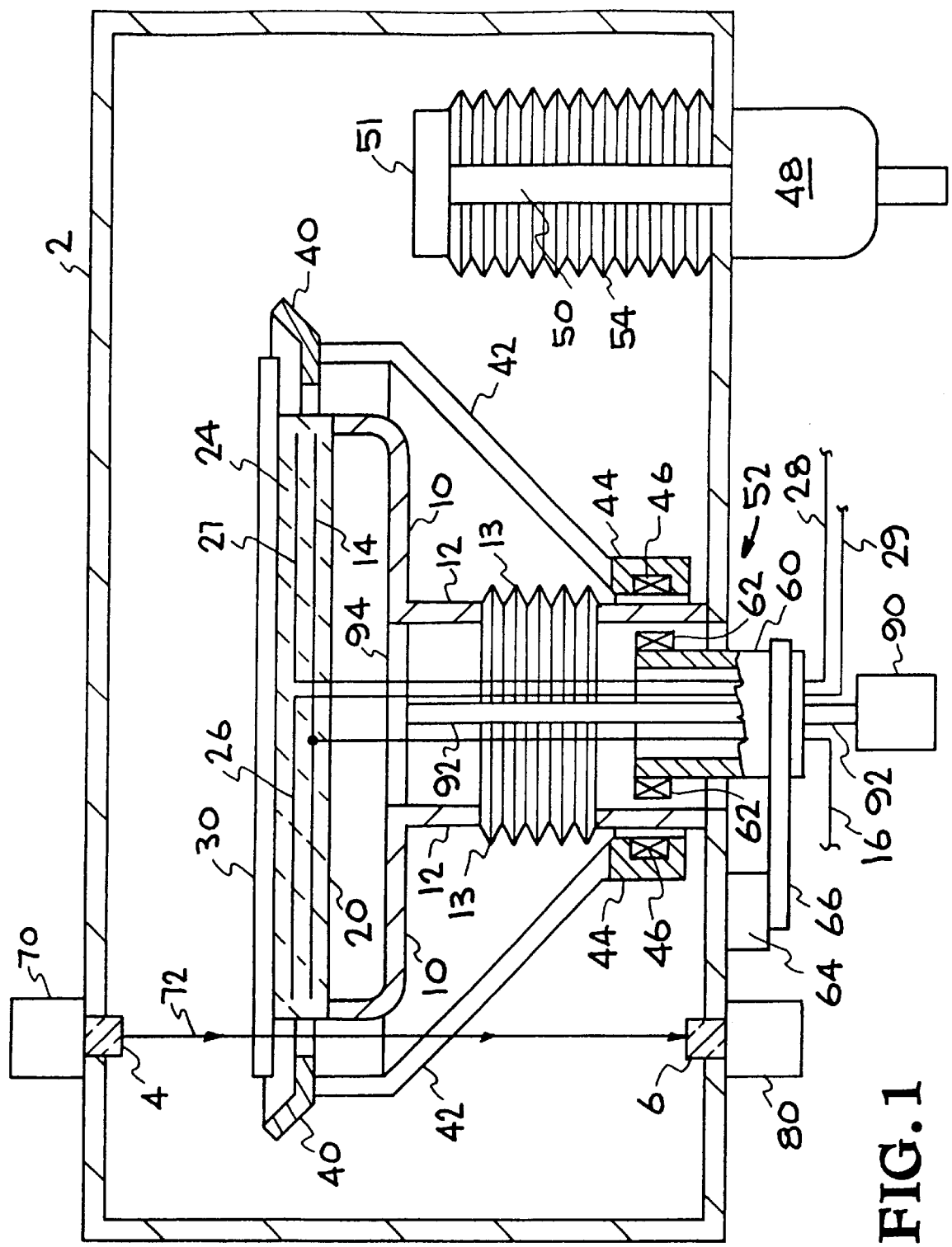
FIG. 1 is a vertical cross-sectional view in schematic form of a degasification and rotational alignment chamber of a semiconductor substrate processing apparatus comprising one embodiment of the invention wherein the substrate is rotationally aligned using a lift ring within the vacuum chamber to rotate the substrate.

Turning now to FIG. 1, one embodiment of the system of the invention is generally illustrated wherein a vacuum chamber 2 is provided with a wafer support 10, which may comprise a stainless steel material, mounted on a pedestal 12. Forming the top surface of wafer support 10 is an electrostatic clamping means or chuck 20 which, in the illustrated embodiment, comprises an insulative material 24, such as aluminum oxide, aluminum nitride, or other ceramic material, on the top surface of wafer support 10 and having embedded therein metallic electrodes 26 and 27 which are connected through leads 28 and 29 to a high voltage source (not shown) external to vacuum chamber 2. Also embedded within chuck 20 is a heater 14, such as a resistance heater, which may be connected through lead(s) 16 to a power source (not shown) external to vacuum chamber 2. The inside of wafer support 10 and pedestal 12 are at atmospheric pressure. Wafer support 10 is brazed to ceramic chuck 20 to provide a vacuum seal.

A wafer 30, to be degassed and rotationally aligned, may be placed on electrostatic chuck 20 and electrodes 26 and 27 energized with a high voltage, e.g., about 500–5000 volts DC, to thereby electrostatically clamp wafer 30 to the surface of electrostatic chuck 20. Wafer 30 is removed from the system transfer robot (not shown) for placement on electrostatic chuck 20 (and later removal) by lift pins or fingers (not shown) on a ring (also not shown) attached to support plate 51 which, in turn, is connected to a pneumatic or motor-driven lift motor 48 and shaft 50 through a vacuum isolation bellows 54.

Heater 14 is energized to thereby heat electrostatic chuck 20 which then heats wafer 30 through direct conduction. It should be noted that unlike prior art securement of the wafer to an upper surface of a wafer support during the heating of the wafer, not only is the periphery of the wafer in thermal contact with electrostatic chuck 20 (to provide thermal coupling therebetween), but all of the undersurface of wafer 30 is also in mechanical contact with electrostatic chuck 20 and therefore thermally coupled to electrostatic chuck 20 due to the uniformity of the electrostatic forces across the surface of electrostatic chuck 20. Heater 10 advantageously is activated prior to the electrostatic clamping of wafer 30 to electrostatic chuck 20 to preheat electrostatic chuck 20 and thereby accelerate the heating process. Because of the intimate contact of the wafer to the heated electrostatic chuck, gas between the wafer and the chuck is not required.

Wafer 30 is also rotationally aligned in vacuum chamber 2. Alignment of the rotational or angular orientation of a semiconductor wafer is necessary to provide the correct rotational alignment of a semiconductor wafer in a processing chamber, as is well known to those skilled in the art. Such rotational alignment is facilitated by the provision of some sort of alignment indicia on the wafer itself. A common alignment means is the provision of a flat or notch on one portion of the circumference of a normally circular wafer. A beam of light from a light source is then usually directed perpendicular to the plane of the wafer to intercept the wafer adjacent its edge. As the wafer is rotated, the light is reflected back to the source until the flat or notched portion is encountered, as which point the light beam is transmitted to a photo detector positioned on the other side of the wafer.

As shown in FIG. 1, a ring 40 may be provided to rotate wafer 30 to rotationally align wafer 30 in vacuum chamber 2. When it is desired to rotate wafer 30, the wafer is lowered onto rotatable ring 40. Wafer 30 is lowered onto ring 40 by activation of fluid powered motor 90 to which is attached a shaft 92, as shown in FIG. 1, which is centrally mounted within pedestal 12. Shaft 92 is coupled to the upper portion of pedestal 12 by a cross bar 94. Bellows 13 on pedestal 12 permit the upper portion of pedestal 12, with support 10 and electrostatic chuck 20 secured thereto, to move up and down (vertically) while maintaining the vacuum within chamber 2. This, in turn, permits the desired lowering of wafer 30 onto rotatable ring 40, and subsequent raising of wafer 30 off ring 40 when the orientation step is complete.

Ring 40 is provided with arms 42 which are, in turn, connected to a central cylinder 44 to which are attached a first set of magnets 46 which form a part of magnetic coupling mechanism 52. A hollow shaft 60 located within pedestal 12 has a second set of magnets 62 mounted thereon forming the other portion of magnetic coupling mechanism 52. A motor 64 rotates shaft 60 via a belt 66 and this rotation is transmitted through magnetic coupling mechanism 52 to cylinder 44 and ring 40 to thereby rotate wafer 30.

As wafer 30 is rotated on ring 40 by motor 64, a light source 70, external to vacuum chamber 2, directs a light beam 72 through a first window 4 in the top wall of vacuum chamber 2 toward the top surface of wafer 30 adjacent the periphery thereof. When flat portion or notch 32 of wafer 30 is encountered, as shown in FIG. 2, light beam 72 passes through to a second window 6 located in the bottom wall of vacuum chamber 2 and is detected by photodetector 80, signifying the rotational position of the flat or notched portion 32 of wafer 30.

Figure 2:
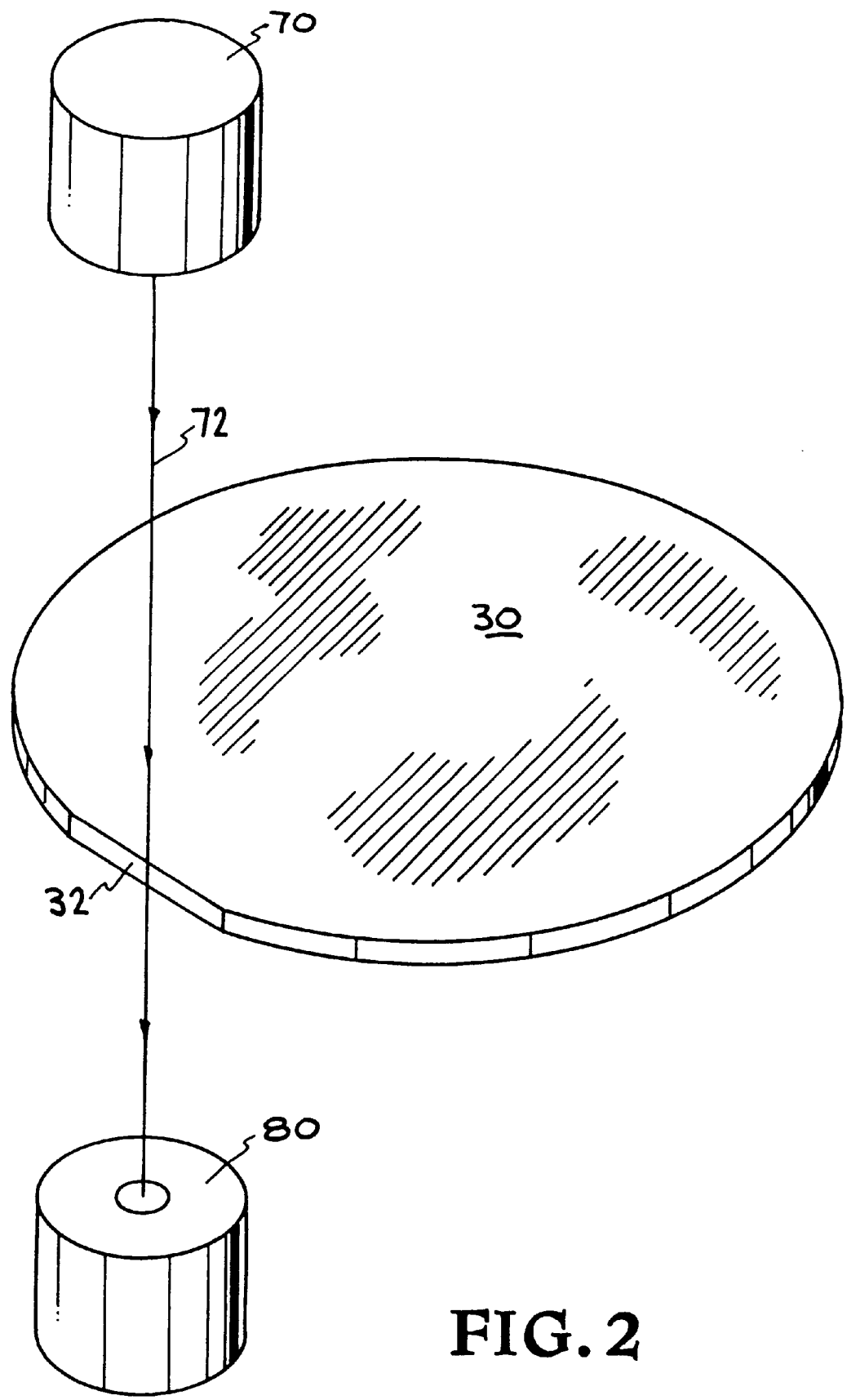
FIG. 2 is an isometric view illustrating the optical orientation apparatus shown in FIG. 1 for rotationally aligning the substrate.

In the embodiment shown in FIGS. 1 and 2, the rotational alignment of wafer 30 is carried out in the same vacuum chamber as the degassification of wafer 30. However, the rotational alignment and degassification are carried out sequentially, rather than simultaneously. The rotational alignment may be carried out either before or after the degassifying of wafer 30.

Figure 3:
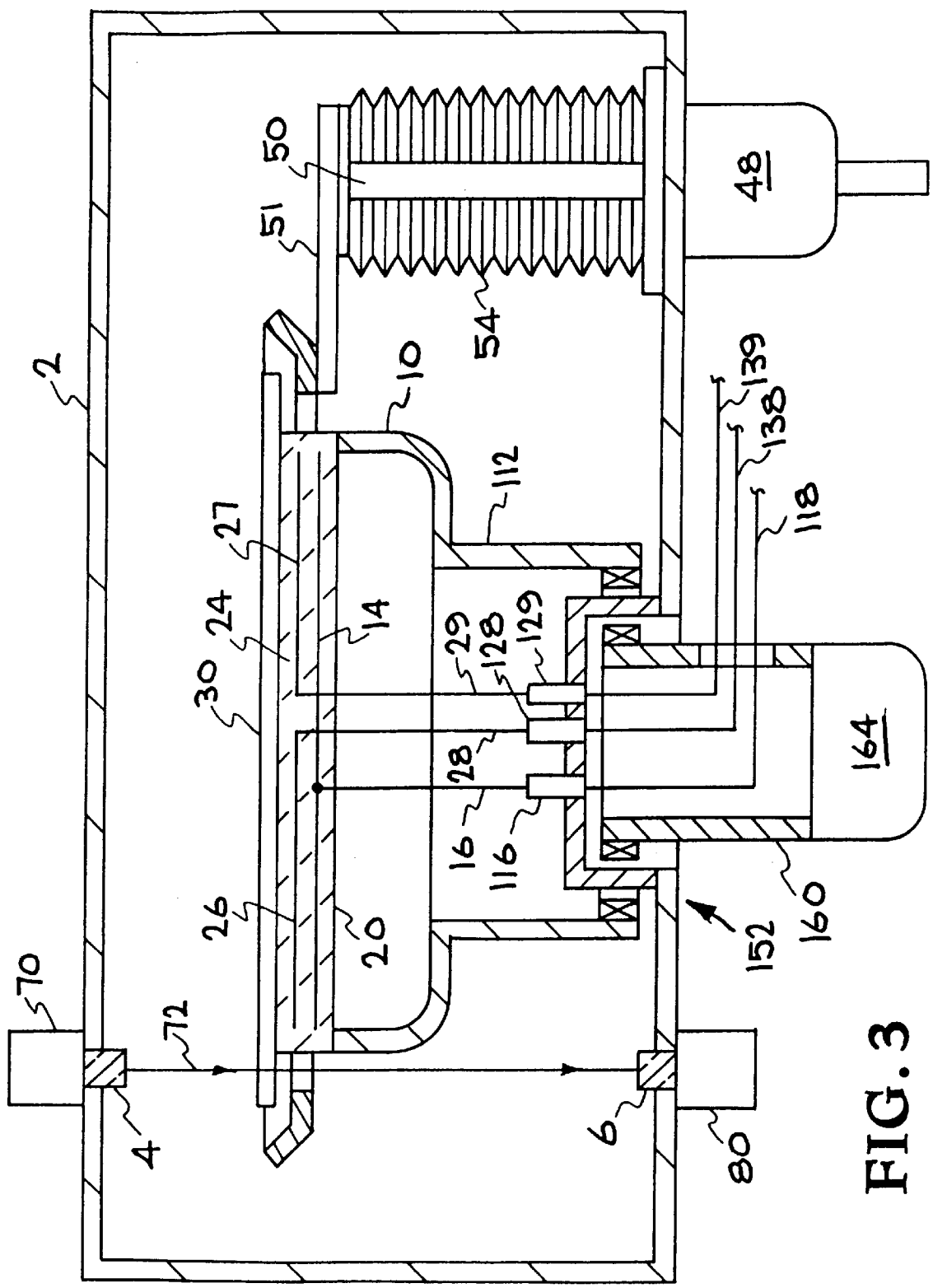
FIG. 3 is a vertical cross-sectional view in schematic form of a degasification and rotational alignment chamber of a semiconductor substrate processing apparatus comprising another embodiment of the invention wherein the substrate is rotationally aligned by rotation of the substrate support and electrostatic chuck therein.

It would, however, be even more advantageous if, in addition to using the same vacuum chamber for both rotational orientation and degassifying of the wafer, both steps could be carried out simultaneously. FIG. 3 illustrates another embodiment of the invention which permits such simultaneous rotational orientation and degassifying of a semiconductor wafer by rotating the wafer support and electrostatic chuck with the wafer clamped thereto so that the wafer continues to be heated and therefore degassified while the rotational orientation of the wafer is carried out by the light source and photodetector.

In FIG. 3, wherein like elements are identified with like numerals, the pedestal beneath wafer support 10 comprises a hollow cylinder 112 with its cylindrical wall magnetically coupled through magnetic coupling mechanism or clutch 152 to a hollow cylindrical shaft 160 external to vacuum chamber 2. Cylindrical shaft 160 is, in turn, connected to a motor 164 which rotates cylindrical shaft 160 and this rotation is transmitted through magnetic coupling 152 to cylindrical pedestal 112 to thereby rotate wafer support 10, electrostatic chuck 20, and wafer 30 clamped thereto.

A flexible heater lead 116 connects heater lead 16 within vacuum chamber 2 to an external heater lead 118; while flexible high voltage leads 128 and 129 connect high voltage leads 28 and 29 with external high voltage lead 138 and 139. This provision of such flexible leads permits rotation of wafer support 10, for example, 180° in each direction while still maintaining electrical contact respectively to heater 14 and electrostatic chuck electrodes 26 and 27.

As described in the previous embodiment, as wafer 30 is rotated by motor 164, light source 70, external to vacuum chamber 2, directs light beam 72 through first window 4 in the top wall of vacuum chamber 2 toward the top surface of wafer 30 adjacent the periphery thereof. When flat portion 32 of wafer 30 is encountered, as previously shown and described in FIG. 2, light beam 72 passes to and through second window 6 located in the bottom wall of vacuum chamber 2 and is detected by photodetector 80, signifying the rotational position of flat or notched portion 32 of wafer 30.

Thus the semiconductor wafer processing system of the invention permits degassifying and rotational alignment of a semiconductor wafer to be carried out in the same vacuum chamber with temperatures above 350° C. being utilizable without, however, mechanical clamping the wafer to the wafer support. In a preferred embodiment, rotational alignment and degassification of the semiconductor wafer may be carried out simultaneously in the same chamber.

Having thus described the invention what is claimed is:

1. A process for degassing a semiconductor substrate and also orienting the substrate in the same vacuum chamber which comprises:
    a) providing a vacuum chamber;
    b) supporting a semiconductor substrate on a heated electrostatic clamping structure functioning as a substrate support for retaining said semiconductor substrate in thermal communication therewith in said vacuum chamber;
    c) heating said electrostatically clamped substrate in said vacuum chamber to a temperature sufficiently to degas said electrostatically clamped substrate by providing a heater within said electrostatic clamping structure;
    d) rotating said substrate in said vacuum chamber while heating and degassing said semiconductor substrate; and
    e) while simultaneously rotating said substrate, and heating said semiconductor substrate to degas it, aligning said semiconductor substrate in said vacuum chamber using a water alignment mechanism capable of a detecting the rotational alignment of said substrate in response to said rotating of said substrate, said aligning step further comprising:
        i) directing a beam of light perpendicular to the plane of said substrate from a light source on one side of said substrate; and
        ii) detecting said beam of light from said light source with a photodetector on an opposite side of said substrate when said beam of light encounters a non-circular portion of said substrate as said substrate rotates.

2. The process for degassing said semiconductor substrate of claim 1 wherein said step of rotating said substrate further comprises lifting said substrate off said substrate support using a rotatable ring within said vacuum chamber.

3. The semiconductor processing apparatus of claim 2 wherein said step of rotating said substrate further comprise magnetically coupling said rotating ring to a source of rotation outside of said vacuum chamber.

4. A process capable of degassing a semiconductor substrate in a vacuum chamber of a semiconductor processing apparatus and also rotationally aligning said substrate in said vacuum chamber which comprises:
    a) providing a vacuum chamber;
    b) supporting a semiconductor substrate on a heated electrostatic clamping structure functioning as a substrate support for retaining said semiconductor substrate in thermal communication therewith in said vacuum chamber;
    c) heating said electrostatically clamped substrate in said vacuum chamber to a temperature sufficient to degas said substrate via a heater within said electrostatic clamping structure;
    d) rotating said substrate in said vacuum chamber up to 180° in either one or both directions using a rotation mechanism; and
    e) aligning said substrate in said vacuum chamber using a wafer alignment mechanism capable of determining the rotational alignment of said substrate in response to said rotation of said substrate in said vacuum chamber, said aligning further comprising:

i) directing a beam of light perpendicular to the plane of said substrate from a light source on one side of said substrate; and ii) detecting said beam of light from said light source with a photodetector on an opposite side of said substrate when said beam of light encounters a non-circular portion of said substrate as said substrate rotates.

5. The process of claim 4 wherein said step of heating said substrate further comprises heating said substrate with a heater comprising a resistance heater in said electrostatic clamping structure adjacent a surface of said substrate support in thermal communication with said substrate.

6. The process of claim 4 wherein said step of supporting a semiconductor substrate on a heated electrostatic clamping structure further comprises clamping said substrate to insulation on the surface of said electrostatic clamping structure facing an undersurface of said substrate, said insulation having one or more high voltage electrodes therein.

7. The process of claim 4 wherein said step of rotating said substrate in said vacuum chamber using a rotation mechanism further comprises rotating said substrate using a rotatable ring within said vacuum chamber.

8. The process of claim 7 wherein said step of rotating said substrate in said vacuum chamber using a rotation mechanism further comprises coupling said rotatable ring through a magnetic coupling to a source of rotation outside of said vacuum chamber.

9. The process of claim 7 wherein said step of rotating said substrate in said chamber using a rotation mechanism further comprises using a rotatable heated electrostatic clamping mechanism to permit said substrate to be rotationally aligned while said substrate is heated to degas said substrate.

10. A process capable of degassing a semiconductor substrate in a vacuum chamber and also rotationally aligning said substrate in said vacuum chamber which comprises:

a) providing a vacuum chamber;

b) supporting a semiconductor substrate on an electrostatic clamping mechanism on a substrate support within said vacuum chamber to retain said semiconductor substrate in thermal communication with said substrate support in said vacuum chamber, said electrostatic clamping mechanism comprising insulation on the surface of said substrate support facing an undersurface of said substrate, and a high voltage electrode in said insulation;

c) heating said substrate with a heater within said electrostatic clamping mechanism capable of heating said electrostatically clamped substrate in said vacuum chamber to a temperature in excess of 350° C. to degas said substrate;

d) rotating said substrate in said vacuum chamber using a rotation mechanism capable of imparting rotation to said substrate in said vacuum chamber comprising:
i) a rotatable ring within said vacuum chamber; and
ii) a magnetic coupling to couple said rotatable ring to a source of rotation outside of said vacuum chamber; and e) aligning said substrate in said vacuum chamber using a wafer alignment mechanism capable of determining the rotational alignment of said substrate in response to said rotation of said substrate in said vacuum chamber, said aligning further comprising:
i) directing a beam of light perpendicular to the plane of said substrate from a light source on one side of said substrate located outside of said vacuum chamber, said light source capable of directing said beam of light through a first window in a first wall of said vacuum chamber; and
ii) detecting said beam of light with a photodetector located outside of said vacuum chamber on an opposite side of said substrate, said photodetector capable of detecting said beam of light from said light source through a window in a second wall of said vacuum chamber when said beam of light encounters a non-circular portion of said substrate as said substrate rotates.

11. A process capable of degassing a semiconductor wafer in a vacuum chamber and also simultaneously rotationally orienting said wafer in said vacuum chamber which comprises:

a) providing a vacuum chamber;

b) supporting a semiconductor wafer on an electrostatic clamping structure within said vacuum chamber to retain said semiconductor wafer in thermal communication therewith in said vacuum chamber, said electrostatic clamping structure comprising insulation on a surface thereof facing an undersurface of said wafer, and a high voltage electrode in said insulation;

c) heating said electrostatically clamped wafer in said vacuum chamber to a temperature in excess of 350° C. and up to as high as 500° C. to degas said wafer via a heater in said electrostatic clamping structure;

d) rotating said wafer in said vacuum chamber up to 180° in either one or both directions, using a rotation mechanism to impart rotation to said wafer in said vacuum chamber, while said wafer is being heated sufficiently to degas it and;

e) aligning said wafer in said vacuum chamber using a wafer alignment mechanism capable of determining the rotational alignment of said wafer in response to said rotation of said wafer in said vacuum chamber, said aligning further comprising:
i) directing a beam of light perpendicular to the plane of said wafer from a light source on one side of said wafer and adjacent the periphery of said wafer; and
ii) detecting said beam of light from said light source with a photodetector on an opposite side of said wafer when said beam of light encounters a non-circular peripheral portion of said wafer as said wafer rotates;

whereby said semiconductor wafer can be rotationally aligned while being simultaneously heated to degasify said wafer.

\* \* \* \* \*